United States Patent [19]

Sari

[11] Patent Number: 4,643,129

[45] Date of Patent: Feb. 17, 1987

[54] SYSTEM FOR THE TREATMENT OF EDGE SUPPORTED SUBSTRATES

[75] Inventor: Eric T. Sari, Plymouth, Minn.

[73] Assignee: ETS Energy Technology Systems Inc., Plymouth, Minn.

[21] Appl. No.: 775,636

[22] Filed: Sep. 13, 1985

[51] Int. Cl.[4] .................................................. B05B 5/00
[52] U.S. Cl. ..................................... 118/641; 118/500; 198/817; 198/848; 198/850
[58] Field of Search ................. 118/641, 500; 198/817, 198/848, 850

Primary Examiner—Bernard D. Pianalto
Attorney, Agent, or Firm—Burd, Bartz & Gutenkauf

[57] ABSTRACT

A system for the thermal and/or liquid treatment of edge supported substrates, such as printed electronic circuit boards and hybrid circuits. The system includes an elongated tunnel treating chamber. The system includes a conveyor system comprised of a pair of lubricant-free chain conveyors supported for movement through the treating chamber on a pair of elongated tracks. The lubricant-free conveyor is comprised of a plurality of successively interconnected wire links each comprising a horizontal member in engagement with the top surface of the track, a pair of spaced apart generally vertical members spaced from the horizontal member and connected thereto and in loose engagement with the sides of the track, and an integral substrate-supporting pin extending outwardly from one of the vertical members. The pins of each conveyor are directed inwardly toward each other to support a substrate therebetween by its edges. The links are interconnected by virtue of the horizontal member of one link engaging the vertical members of an adjacent link.

10 Claims, 6 Drawing Figures

SYSTEM FOR THE TREATMENT OF EDGE SUPPORTED SUBSTRATES

BACKGROUND OF THE INVENTION

1. Field of the Invention

This invention is directed to a system for the thermal and/or liquid treatment of edge supported substrates, such as printed electronic circuit boards. More particularly, the invention is directed to a novel lubricant-free chain link conveyor having substrate-supporting pins for suspending the circuit boards or hybrid circuits or similar substrates by their edges in the course of passage through thermal and/or liquid treatment.

In the manufacture of printed circuit boards or hybrid circuits, it is common practice to subject the boards to successive liquid and thermal treatment steps including solvent degreasing, spray coating, drying, baking, and the like. Such treatments are difficult to carry out on a continuous basis utilizing available conveyor systems since the treatments have a deleterious effect on the conveyor systems, as by removing lubricant, baking and solidifying lubricant, and the like. The present invention is directed toward alleviation of the deficiencies of the prior art.

2. The Prior Art

According to current practice, circuit boards are transported through treating chambers by means of full product width wire mesh conveyor belts or roller-type chain conveyors. The successive hubs of a roller chain are provided with projecting pins. Panels to be treated are supported on those pins between a pair of chains and carried through a treating chamber. Such conveyors tend to fail through loss of lubricant in solvent degreasing treatments, by congealing of the lubricant in heating treatments, and the like.

SUMMARY OF THE INVENTION

The present invention is directed to a system for the thermal and/or liquid treatment of edge supported substrates alleviating the problems of the prior art. The system includes an elongated tunnel treating chamber provided with elements for liquid and/or thermal treatment of substrates carried through the treating chamber. The conveyor system for transporting material through the treating chamber includes a pair of elongated tracks extending through the treating chamber. These tracks are supported by members disposed outside of the treating chamber at the opposite ends of the chamber. A lubricant-free chain conveyor is provided on each track, the conveyors each comprising a plurality of successively interconnected wire links. Each link comprises a generally horizontal member in engagement with the top surface of the track, a pair of spaced apart generally vertical members spaced from the horizontal member and connected thereto, and in engagement with the sides of the track, and an integral substrate-supporting pin extending outwardly from one of the link vertical members, the pins of each conveyor being directed inwardly toward each other to support a substrate between the conveyor chains by the edges of the substrate. The conveyor links are interconnected by the horizontal member of one link engaging the vertical members of the next adjacent link. Means are provided for moving the conveyors along the tracks through the treating chamber.

BRIEF DESCRIPTION OF THE DRAWINGS

The invention is described in the accompanying drawings in which corresponding parts are identified by the same numerals and in which.

DETAILED DESCRIPTION OF THE PREFERRED EMBODIMENT

Figure 1:
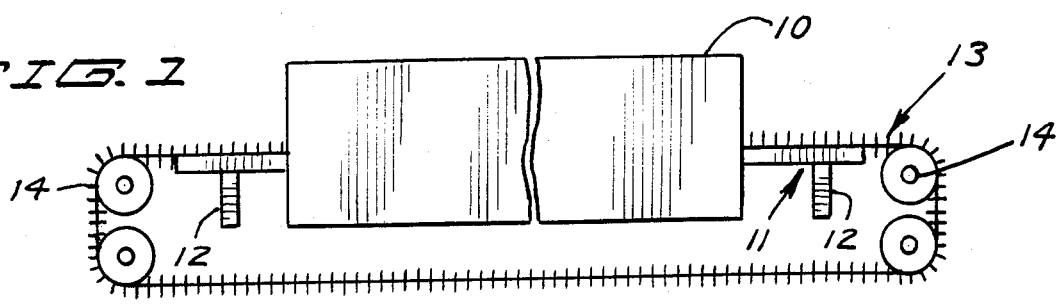
FIG. 1 is a schematic side elevation of a system according to the present invention comprising a treating chamber, conveyor supporting track and drive.
Figures 2, 3:
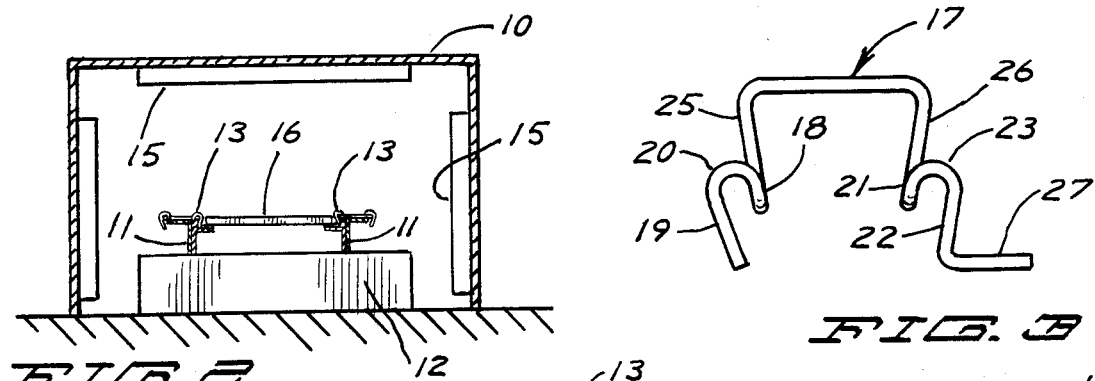
FIG. 2 is a schematic end elevation thereof.
FIG. 3 is an isometric view of a single preferred form of conveyor chain link.

Referring now to the drawings, and particularly to FIGS. 1 and 2, there is shown in schematic form a system for treating edge supported substrates in the course of passage through a treating chamber. The system comprises a treating chamber in the form of an open-ended tunnel 10 through which a continuous conveyor passes. A pair of parallel spaced apart horizontal conveyor tracks 11 extend through the entire length of the tunnel chamber 10. The opposite ends of tracks 11 are supported by horizontal members 12 at the opposite ends of the treatment tunnel. A pair of continuous chain link conveyors 13 extend through tunnel chamber 10 supported on tracks 11. Conveyors 13 are supported in their passage by wheels or rollers 14, one of which is driven and preferably provided with cogs or other engaging means to facilitate travel of the chain conveyors. The inside of the tunnel chamber 10 is provided with thermal and/or liquid treating elements 15 adjacent to the path of the conveyor. These may be, for example, radiant heating lamps or other heating units, liquid spray heads, or the like. The different treatment elements may be spaced apart within the same long tunnel chamber or in separate chambers, depending upon the requirements of the particular substrate being treated. The substrate 16 is supported by its edges between the chain conveyors for its passage through the chamber 10.

Referring now to FIGS. 3 through 6, there is shown a preferred form of chain link conveyor and supporting track. Each conveyor 13 is composed of a plurality of interconnected identical links 17. A preferred form of link is shown in isometric view in FIG. 3, in top plan view in FIG. 4, in side elevation in FIG. 5, and in front elevation in FIG. 6. The links are formed from wire, typically steel, capable of withstanding the conditions to which they are subjected in the course of treatment.

Each link 17 is composed of a pair of laterally spaced apart generally vertically extending first loops. One of these first loops has a short leg 18 and a longer leg 19 joined at their upper ends by an integral arcuate member 20. The other of the first loops has a short leg 21 and a longer leg 22 joined together at their upper ends by an integral arcuate member 23. Both of these first loops are open at their lower ends to facilitate interconnection of adjacent links, and lie generally in a common plane.

A larger open ended second loop lies in a plane generally perpendicular to that of the first loops. This second loop includes a straight end member 24 which lies in a plane which is generally parallel to the plane of the first loops. The ends of second loop member 24 are each integrally connected to one end of a pair of spaced apart arms 25 and 26. The opposite ends of arms 25 and 26 are integrally connected to the spaced apart innermost shorter legs 18 and 21, respectively, of the first loops. The end member 24 of the second larger loop has a length approximately equal to the distance between the centers of the first loops and arms 25 and 26 converge slightly.

Figure 4:
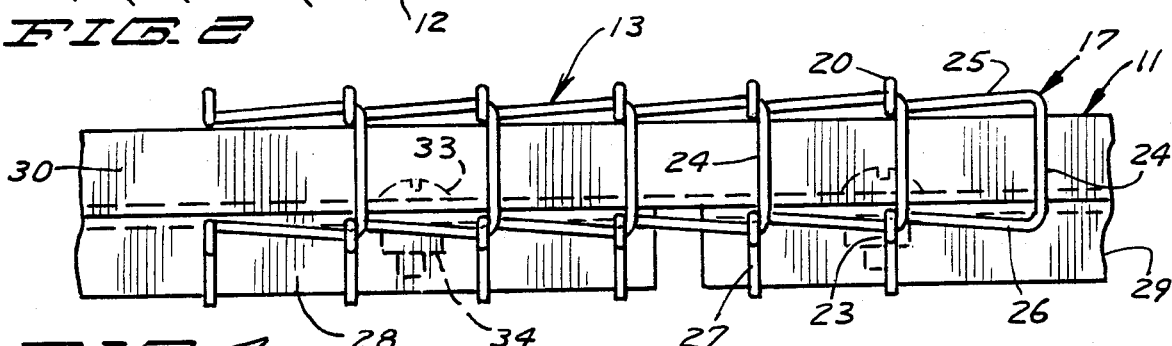
FIG. 4 is a fragmentary top plan view of a segment of chain link conveyor and supporting track.

As best seen in FIG. 4, adjacent links are interconnected by arms 25 and 26 extending through the first loops of the next adjacent link. Then, when tension is exerted upon the links, the end member 24 engages the first loops. When a large number of links are interconnected in a continuous chain link conveyor belt, and driven, the pulling force is transmitted from link to link through engagement of the first loops and end members, in either direction.

Figure 6:
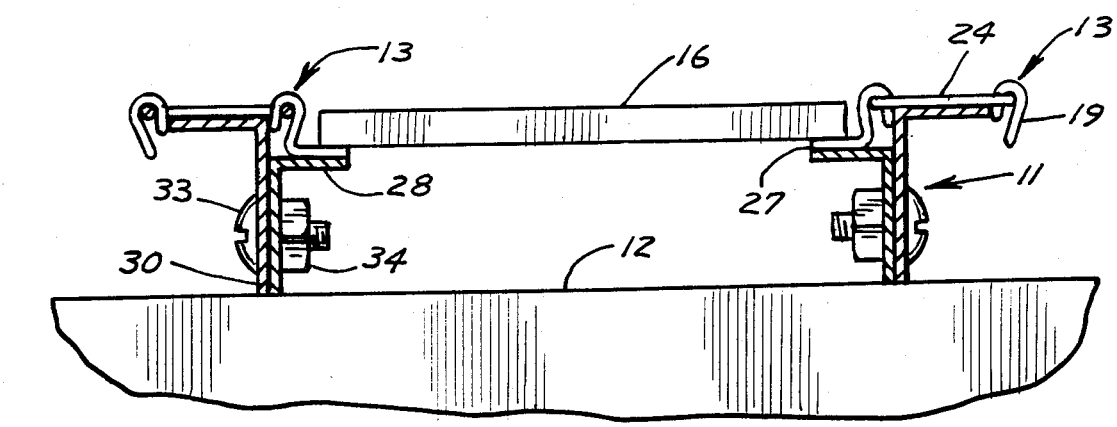
FIG. 6 is an end elevation showing a pair of conveyors and their support tracks supporting a substrate for passage through a treating chamber.

A horizontal substrate-supporting pin 27 extends outwardly from the longer leg 22 of one of the first link loops. Pin 27 lies generally in the same vertical plane as the first loops. As best seen in FIG. 6, pins 27 on oppositely disposed parallel conveyors 13 support a substrate 16 by its edges for passage through a treating chamber.

In its passage through a treating chamber, the conveyor 13 is supported on track 11. In the assembled conveyor, link end members 24 engage and ride upon the top surface of the track. To maintain the conveyor on the track, the first loop longer legs 19 and 22 extend below the top surface of the track and loosely engage the sides of the top surface of the track as the conveyor is moved along.

Figure 5:
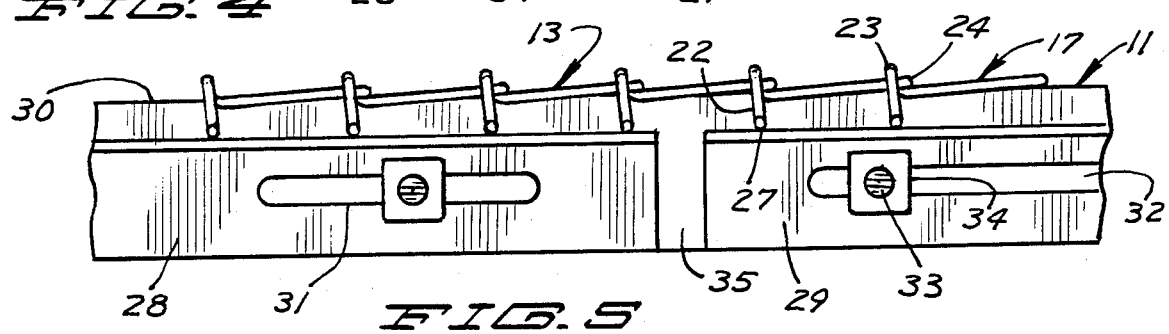
FIG. 5 is a side elevation thereof.

The track 11 preferably has the two-step structure shown in FIGS. 4, 5 and 6. The elongated track 11 is composed of two sets of shorter vertically disposed elongated slotted angle bars each assembled in end-to-end relation and in overlapping side-by-side relation. Thus, angle bars 28 and 29 are assembled in end-to-end relation and overlap angle bar 30, but the top surfaces of angle bars 28 and 29 are vertically displaced below the top surface of angle bar 30 by the vertical distance between link member 24 and pin 27. The top surfaces of angle bars 28 and 29 extend laterally outward beyond the edge of the top surface of angle bar 30 by a distance about equal to the length of pin 27. Thus, link member 24 engages the top surface of angle bar 30 and link pin 27 engages the top surfaces of angle bars 28 and 29. Angle bars 28 and 29 are slotted at 31 and 32, respectively, and secured to angle bar 30 by suitable fastening means, such as bolts 33 and nuts 34. To prevent buckling of the track when used in a thermal treating chamber, to allow for expansion, a small gap 35 is left between the ends of adjacent angle bars.

It is apparent that many modifications and variations of this invention as hereinbefore set forth may be made without departing from the spirit and scope thereof. The specific embodiments described are given by way of example only and the invention is limited only by the terms of the appended claims.

The embodiments of the invention in which an exclusive property or privilege is claimed are defined as follows:

1. A system for the thermal and liquid treatment of edge supported substrates comprising:
   (A) an elongated tunnel treating chamber,
   (B) a pair of elongated tracks extending through said chamber,
   (C) support members for said tracks outside of said chamber at opposite ends thereof,
   (D) a lubricant-free chain conveyor on each of said tracks, said conveyor comprising a plurality of successively interconnected wire links each comprising:
      (1) a generally horizontal member in engagement with the top surface of said track,
      (2) a pair of spaced apart generally vertical members spaced from said horizontal member and connected thereto, and in loose engagement with the sides of said track,
      (3) an integral substrate-supporting pin extending outwardly from one of said vertical members, the pins of each conveyor being directed inwardly toward each other to support a substrate therebetween by its edges,
      (4) a connection between said links, the horizontal member of one link engaging the vertical members of an adjacent link, and
   (E) means for moving said conveyors along said tracks.

2. A system according to claim 1 wherein said tunnel treating chamber includes thermal treating elements adjacent the conveyor path.

3. A system according to claim 2 wherein said thermal treating units are heating units.

4. A system according to claim 1 wherein said tunnel treating chamber includes liquid treating elements adjacent the conveyor path.

5. A system according to claim 4 wherein said liquid treating elements are solvent spray heads.

6. A system according to claim 1 wherein said tracks are each composed of one set of a plurality of shorter elongated slotted bars in end-to-end relation secured together in overlapping side-by-side relation with a second set of similar bars, with a small gap between the ends of adjacent bars.

7. A system according to claim 1 wherein the links of said conveyor are each comprised of:
   (A) a pair of laterally spaced apart generally vertically extending first loops having a pair of legs joined at their upper ends by an integral arcuate member, said first loops being open at their lower ends, and lying in a common plane,
   (B) a generally horizontal open second loop having an end member lying in a plane generally parallel to the plane of said first loops, said second loop being larger than said first loops, the ends of said end member each being integrally connected to one end of a pair of spaced apart arms whose opposite ends are integrally connected to the spaced apart innermost legs of said first loops, and said second loop lying in a plane generally perpendicular to the plane of said first loops,
   (C) a substrate-supporting pin integral with and extending outwardly from the bottom end of the outermost leg of one of said first loops and in generally the same vertical plane as said first loops, and
   (D) a connection between said links, the arms of the second loop of one link extending through the first loops of an adjacent link and said second loop end member engaging the first loops.

8. A lubricant-free conveyor for carrying substrates through a treatment chamber, said conveyor comprising:

(A) a pair of parallel chains each composed of a plurality of successively interconnected wire links, each link comprising:
  (1) a generally horizontal member,
  (2) a pair of spaced apart generally vertical members spaced from said horizontal member and connected thereto,
  (3) an integral substrate-supporting pin extending outwardly from one of said vertical members, and
  (4) a connection between said links, the horizontal member of one link engaging the vertical members of an adjacent link, and
(B) a pair of elongated parallel generally horizontal chain supporting tracks underlying said parallel chains, said horizontal link members engaging the top surfaces of the tracks, said vertical link members loosely engaging the sides of the tracks, and said substrate-support pins extending inwardly from the inner surfaces of the tracks to support a substrate therebetween by its edges.

9. A lubricant-free conveyor according to claim 8 wherein the links of said conveyor are each comprised of:
(A) a pair of laterally spaced apart generally vertically extending first loops having a pair of legs joined at their upper ends by an integral arcuate member, said first loops being open at their lower ends, and lying generally in a common plane,
(B) a generally horizontal open second loop having an end member lying in a plane generally parallel to the plane of said first loops, said second loop being larger than said first loops, the ends of said end member each being integrally connected to one end of a pair of spaced apart arms whose opposite ends are integrally connected to the spaced apart innermost legs of said first loops, and said second loop lying in a plane generally perpendicular to the plane of said first loops,
(C) a substrate-supporting pin integral with and extending outwardly from the bottom end of the outermost leg of one of said first loops and in generally the same vertical plane as said first loops, and
(D) a connection between said links, the arms of the second loop of one link extending through the first loops of an adjacent link and said second loop end member engaging said first loops.

10. A lubricant-free conveyor according to claim 8 wherein said elongated tracks are each comprised of one set of a plurality of shorter elongated slotted bars in end-to-end relation secured together in overlapping side-by-side relation with a second set of similar bars, with a small gap between the ends of adjacent bars.

* * * * *